(12) United States Patent
Baronne et al.

(10) Patent No.: US 12,135,987 B2
(45) Date of Patent: Nov. 5, 2024

(54) THREAD SCHEDULING CONTROL AND MEMORY SPLITTING IN A BARREL PROCESSOR

(71) Applicant: Micron Technology, Inc., Boise, ID (US)

(72) Inventors: Chris Baronne, Allen, TX (US); Dean E. Walker, Allen, TX (US); John Amelio, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 682 days.

(21) Appl. No.: 17/075,096

(22) Filed: Oct. 20, 2020

(65) Prior Publication Data

US 2022/0121487 A1 Apr. 21, 2022

(51) Int. Cl.
  *G06F 9/48* (2006.01)
  *G06F 9/30* (2018.01)
  *G11C 7/10* (2006.01)
  *G11C 7/22* (2006.01)

(52) U.S. Cl.
  CPC .......... *G06F 9/4881* (2013.01); *G06F 9/3009* (2013.01); *G06F 9/30101* (2013.01); *G11C 7/1072* (2013.01); *G11C 7/22* (2013.01)

(58) Field of Classification Search
  CPC .. G06F 9/4881; G06F 9/3009; G06F 9/30101; G11C 7/1072; G11C 7/22
  See application file for complete search history.

(56) References Cited

U.S. PATENT DOCUMENTS

| | | | |
|---|---|---|---|
| 4,071,701 A * | 1/1978 | Leijonhufvud | H04L 12/52 370/379 |
| 9,223,580 B2 | 12/2015 | Eichenberger et al. | |
| 9,235,418 B2 | 1/2016 | Ahmed et al. | |
| 2010/0281234 A1 * | 11/2010 | Ahmed | G06F 9/3885 712/E9.016 |
| 2018/0011738 A1 | 1/2018 | Abdallah | |

(Continued)

FOREIGN PATENT DOCUMENTS

WO 2022086763 4/2022

OTHER PUBLICATIONS

"International Application Serial No. PCT US2021 054639, International Search Report mailed Feb. 4, 2022", 4 pgs.

(Continued)

*Primary Examiner* — Wissam Rashid
(74) *Attorney, Agent, or Firm* — Schwegman Lundberg & Woessner, P.A.

(57) ABSTRACT

Devices and techniques for sharing thread memory in a barrel processor via scheduling are described herein. An apparatus includes a barrel processor, which includes thread scheduling circuitry, where the barrel processor is configured to perform operations through use of the thread scheduling circuitry, the operations including those to: place a thread to be scheduled in one of two groups: a first group and a second group, wherein the first group is associated with a first processor storage device, and the second group is associated with a second processor storage device; and schedule a current thread to place into a pipeline for the barrel processor, the scheduling performed by alternating between threads in the first group and threads in the second group.

25 Claims, 7 Drawing Sheets

(56) References Cited

U.S. PATENT DOCUMENTS

2019/0121679 A1 4/2019 Wilkinson et al.
2019/0155648 A1 5/2019 Knowles

OTHER PUBLICATIONS

"International Application Serial No. PCT US2021 054639, Written Opinion mailed Feb. 4, 2022", 4 pgs.
"International Application Serial No. PCT US2021 054639, International Preliminary Report on Patentability mailed May 4, 2023", 6 pgs.

* cited by examiner

THREAD SCHEDULING CONTROL AND MEMORY SPLITTING IN A BARREL PROCESSOR

BACKGROUND

Chiplets are an emerging technique for integrating various processing functionalities. Generally, a chiplet system is made up of discrete modules (each a "chiplet") that are integrated on an interposer, and in many examples interconnected as desired through one or more established networks, to provide a system with the desired functionality. The interposer and included chiplets may be packaged together to facilitate interconnection with other components of a larger system. Each chiplet may include one or more individual integrated circuits (ICs), or "chips", potentially in combination with discrete circuit components, and commonly coupled to a respective substrate to facilitate attachment to the interposer. Most or all chiplets in a system may be individually configured for communication through the one or more established networks.

The configuration of chiplets as individual modules of a system is distinct from such a system being implemented on single chips that contain distinct device blocks (e.g., intellectual property (IP) blocks) on one substrate (e.g., single die), such as a system-on-a-chip (SoC), or multiple discrete packaged devices integrated on a printed circuit board (PCB). In general, chiplets provide better performance (e.g., lower power consumption, reduced latency, etc.) than discrete packaged devices, and chiplets provide greater production benefits than single die chips. These production benefits can include higher yields or reduced development costs and time.

Chiplet systems may include, for example, one or more application (or processor) chiplets and one or more support chiplets. Here, the distinction between application and support chiplets is simply a reference to the likely design scenarios for the chiplet system. Thus, for example, a synthetic vision chiplet system can include, by way of example only, an application chiplet to produce the synthetic vision output along with support chiplets, such as a memory controller chiplet, a sensor interface chiplet, or a communication chiplet. In a typical use case, the synthetic vision designer can design the application chiplet and source the support chiplets from other parties. Thus, the design expenditure (e.g., in terms of time or complexity) is reduced because by avoiding the design and production of functionality embodied in the support chiplets. Chiplets also support the tight integration of IP blocks that can otherwise be difficult, such as those manufactured using different processing technologies or using different feature sizes (or utilizing different contact technologies or spacings). Thus, multiple ICs or IC assemblies, with different physical, electrical, or communication characteristics may be assembled in a modular manner to provide an assembly providing desired functionalities. Chiplet systems can also facilitate adaptation to suit needs of different larger systems into which the chiplet system will be incorporated. In an example, ICs or other assemblies can be optimized for the power, speed, or heat generation for a specific function—as can happen with sensors—can be integrated with other devices more easily than attempting to do so on a single die. Additionally, by reducing the overall size of the die, the yield for chiplets tends to be higher than that of more complex, single die devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
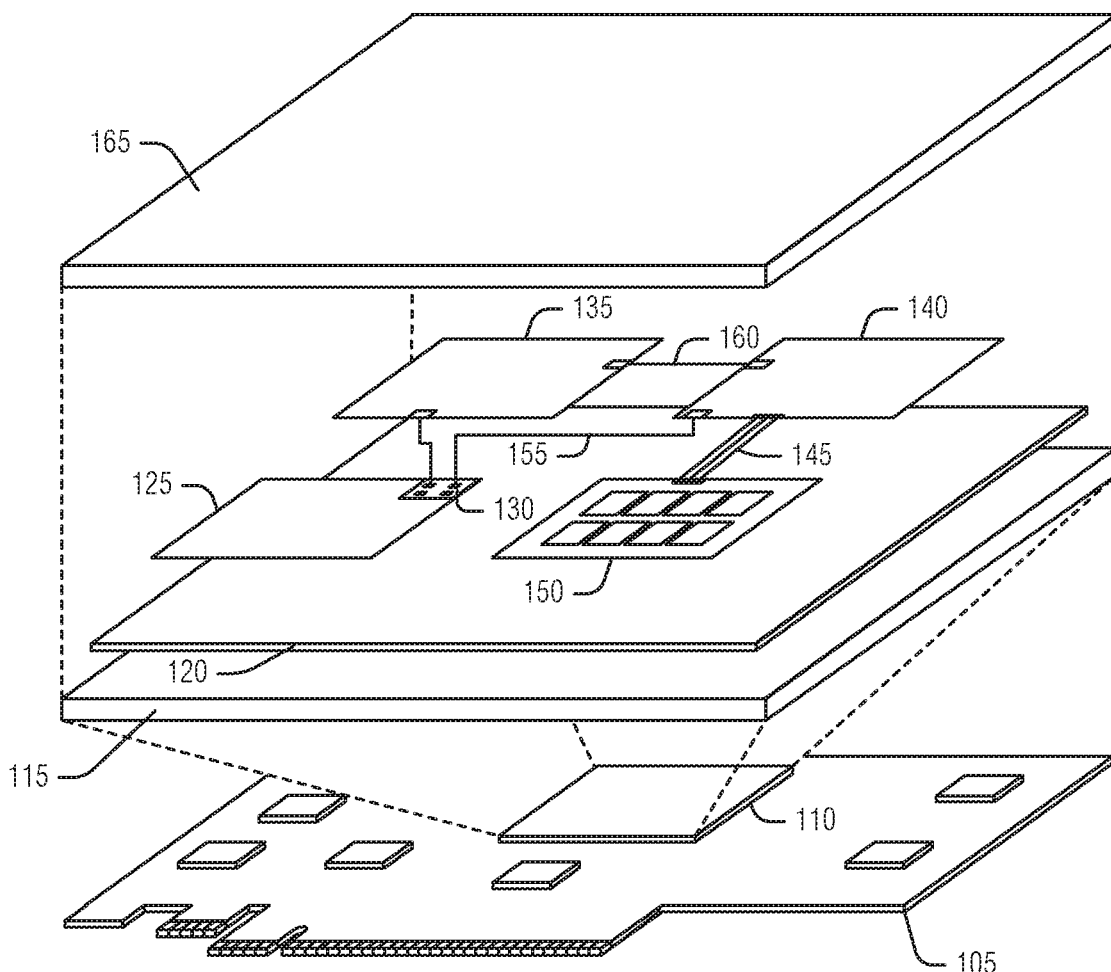
FIGS. 1A and 1B illustrate an example of a chiplet system, according to an embodiment.
Figure 1B:
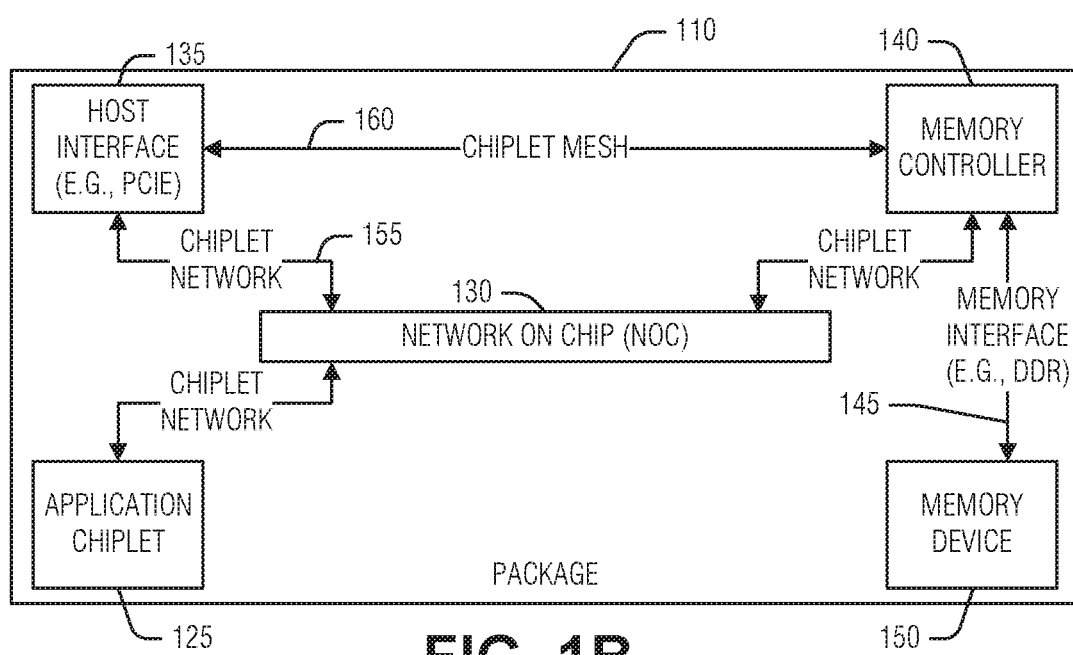

FIGS. 1A-1B, described below, offers an example of a chiplet system and the components operating therein. The illustrated chiplet system includes a memory controller. This memory controller includes a programmable atomic unit (PAU) to execute a custom program, a programmable atomic operation, in response to a memory request for the programmable atomic operation. Additional details about the PAU are described below with respect to FIGS. 2 and 3. The processor of the PAU can be barrel-multithreaded and pipelined.

In a multi-threaded barrel processor, each thread has a corresponding set of registers within a register file. The register file is used to store thread state, intermediate data, and other information. The register files are used to stage data between memory and functional units. As thread instructions are propagated through a compute pipeline, the section of a register file corresponding to the thread is accessed after the instruction decode step to read register state and then later during register write back.

In some cases, the register files for multiple threads are stored in a single memory device, such as a static random access memory (SRAM) device. Though the present subject matter is described in reference to storing register files in SRAM, other memory storage technologies, either volatile or nonvolatile, can be used for storing the register files. For example, flash memory (NAND or NOR), FeRAM, 3D XPoint, phase change memory, resistive memory, and storage technologies that will be apparent to persons skilled in the art having the benefit of this disclosure. In a multi-threaded environment, several thread operations may attempt to read and write to the memory device at the same time to access their respective register files. When there is only one SRAM, which may only have limited read and write ports, there is a possibility of contention on the access ports.

The present disclosure discusses a thread scheduling control mechanism and use of separate memory devices to eliminate memory-based slowdowns or stalls in the compute pipeline. Threads are organized into different groups with each group having its own memory device to store register files for the threads in the group. A thread scheduler alternates between groups, scheduling a thread to enter the pipeline from each group on each successive cycle. When there are two groups, then a thread from a given group is scheduled every other cycle. This scheduling scheme ensures that thread read access to relevant state, register, and cache memory will occur every other cycle. The opposite cycle is then used for write access to the memory device of the given group.

Without the control mechanism discussed herein, multiple threads executing in a barrel processor may attempt to access the memory device in a single cycle. Additional unnecessary cycles may be spent stalling one thread operation and others in the pipeline, to clear out the writeback of another thread operation. These cycles result in wasted time and energy when the threads are rescheduled due to the memory state.

The control mechanism provides distinct advantages by reducing or eliminating memory contention between thread operations. This allows for threads to progress through a compute pipeline more efficiently. Overall throughput is increased, and power draw is reduced as fewer resources are wasted due to aborted operations. The control mechanism provides the further advantages of being less complex to implement and avoiding having to use more expensive three or four port memory devices. These efficiencies can be of particular benefit in a chiplet system including a memory controller, as such systems offer modular capabilities that can, in some embodiments, be configured for enabling relatively high performance memory operations required for systems performing a large number of, and/or relatively high complexity computations.

FIGS. 1A and 1B illustrate an example of a chiplet system 110, according to an embodiment. FIG. 1A is a representation of the chiplet system 110 mounted on a peripheral board 105, that can be connected to a broader computer system by a peripheral component interconnect express (PCIe) interface, for example. The chiplet system 110 includes a package substrate 15, an interposer 120, and four chiplets: an application chiplet 125, a host interface chiplet 135, a memory controller chiplet 140, and a memory device chiplet 150. Other systems may include many additional chiplets to provide additional functionalities as will be apparent from the following discussion. The package of the chiplet system 110 is illustrated with a lid or cover 165, though other packaging techniques and structures for the chiplet system can be used. FIG. 1B is a block diagram labeling the components in the chiplet system for clarity.

The application chiplet 125 is illustrated as including a network-on-chip (NOC) 130 to support a chiplet network 155 for inter-chiplet communications. In example embodiments NOC 130 may be included on the application chiplet 125. In an example, NOC 130 may be defined in response to selected support chiplets (e.g., chiplets 135, 140, and 150) thus enabling a designer to select an appropriate number or chiplet network connections or switches for the NOC 130. In an example, the NOC 130 can be located on a separate chiplet, or even within the interposer 120. In examples as discussed herein, the NOC 130 implements a chiplet protocol interface (CPI) network.

The CPI is a packet-based network that supports virtual channels to enable a flexible and high-speed interaction between chiplets. CPI enables bridging from intra-chiplet networks to the chiplet network 155. For example, the Advanced eXtensible Interface (AXI) is a widely used specification to design intra-chip communications. AXI specifications, however, cover a great variety of physical design options, such as the number of physical channels, signal timing, power, etc. Within a single chip, these options are generally selected to meet design goals, such as power consumption, speed, etc. However, to achieve the flexibility of the chiplet system, an adapter, such as CPI, is used to interface between the various AXI design options that can be implemented in the various chiplets. By enabling a physical channel to virtual channel mapping and encapsulating time-based signaling with a packetized protocol, CPI bridges intra-chiplet networks across the chiplet network 155.

CPI can use a variety of different physical layers to transmit packets. The physical layer can include simple conductive connections, or can include drivers to increase the voltage, or otherwise facilitate transmitting the signals over longer distances. An example of one such physical layer can include the Advanced Interface Bus (AIB), which in various examples, can be implemented in the interposer 120. AIB transmits and receives data using source synchronous data transfers with a forwarded clock. Packets are transferred across the AIB at single data rate (SDR) or dual data rate (DDR) with respect to the transmitted clock. Various channel widths are supported by AIB. AIB channel widths are in multiples of 20 bits when operated in SDR mode (20, 40, 60, . . . ), and multiples of 40 bits for DDR mode: (40, 80, 120, . . . ). The AIB channel width includes both transmit and receive signals. The channel can be configured to have a symmetrical number of transmit (TX) and receive (RX) input/outputs (I/Os), or have a non-symmetrical number of transmitters and receivers (e.g., either all transmitters or all receivers). The channel can act as an AIB control or subordinate (i.e., "master" or "slave") depending on which chiplet provides the master clock. AIB I/O cells support three clocking modes: asynchronous (i.e., non-clocked), SDR, and DDR. In various examples, the non-clocked mode is used for clocks and some control signals. The SDR mode can use dedicated SDR only I/O cells, or dual use SDR/DDR I/O cells.

In an example, CPI packet protocols (e.g., point-to-point or routable) can use symmetrical receive and transmit I/O cells within an AIB channel. The CPI streaming protocol allows more flexible use of the AIB I/O cells. In an example, an AIB channel for streaming mode can configure the I/O cells as all TX, all RX, or half TX and half RX. CPI packet protocols can use an AIB channel in either SDR or DDR operation modes. In an example, the AIB channel is configured in increments of 80 I/O cells (i.e., 40 TX and 40 RX) for SDR mode and 40 I/O cells for DDR mode. The CPI streaming protocol can use an AIB channel in either SDR or DDR operation modes. Here, in an example, the AIB channel is in increments of 40 I/O cells for both SDR and DDR modes. In an example, each AIB channel is assigned a unique interface identifier. The identifier is used during CPI reset and initialization to determine paired AIB channels across connected chiplets. In an example, the interface identifier is a 20-bit value comprising a seven-bit chiplet identifier, a seven-bit column identifier, and a six-bit link identifier. The AIB physical layer transmits the interface identifier using an AIB out-of-band shift register. The 20-bit interface identifier is transferred in both directions across an AIB interface using bits 32-51 of the shift registers.

AIB defines a stacked set of AIB channels as an AIB channel column. An AIB channel column has some number of AIB channels, plus an auxiliary channel. The auxiliary channel contains signals used for AIB initialization. All AIB channels (other than the auxiliary channel) within a column are of the same configuration (e.g., all TX, all RX, or half TX and half RX, as well as having the same number of data I/O signals). In an example, AIB channels are numbered in continuous increasing order starting with the AIB channel adjacent to the AUX channel. The AIB channel adjacent to the AUX is defined to be AIB channel zero.

Generally, CPI interfaces on individual chiplets can include serialization-deserialization (SERDES) hardware. SERDES interconnects work well for scenarios in which high-speed signaling with low signal count are desirable. SERDES, however, can result in additional power consumption and longer latencies for multiplexing and demultiplexing, error detection or correction (e.g., using block level cyclic redundancy checking (CRC)), link-level retry, or forward error correction. However, when low latency or energy consumption is a primary concern for ultra-short reach, chiplet-to-chiplet interconnects, a parallel interface with clock rates that allow data transfer with minimal latency may be utilized. CPI includes elements to minimize both latency and energy consumption in these ultra-short reach chiplet interconnects.

For flow control, CPI employs a credit-based technique. A recipient, such as the application chiplet 125, provides a sender, such as the memory controller chiplet 140, with credits that represent available buffers. In an example, a CPI recipient includes a buffer for each virtual channel for a given time-unit of transmission. Thus, if the CPI recipient supports five messages in time and a single virtual channel, the recipient has five buffers arranged in five rows (e.g., one row for each unit time). If four virtual channels are supported, then the recipient has twenty buffers arranged in five rows. Each buffer holds the payload of one CPI packet.

When the sender transmits to the recipient, the sender decrements the available credits based on the transmission. Once all credits for the recipient are consumed, the sender stops sending packets to the recipient. This ensures that the recipient always has an available buffer to store the transmission.

As the recipient processes received packets and frees buffers, the recipient communicates the available buffer space back to the sender. This credit return can then be used by the sender allow transmitting of additional information.

Also illustrated is a chiplet mesh network 160 that uses a direct, chiplet-to-chiplet technique without the need for the NOC 130. The chiplet mesh network 160 can be implemented in CPI, or another chiplet-to-chiplet protocol. The chiplet mesh network 160 generally enables a pipeline of chiplets where one chiplet serves as the interface to the pipeline while other chiplets in the pipeline interface only with themselves.

Additionally, dedicated device interfaces, such as one or more industry standard memory interfaces 145 (such as, for example, synchronous memory interfaces, such as DDR5, DDR6), can also be used to interconnect chiplets. Connection of a chiplet system or individual chiplets to external devices (such as a larger system can be through a desired interface (for example, a PCIE interface). Such as external interface may be implemented, in an example, through a host interface chiplet 135, which in the depicted example, provides a PCIE interface external to chiplet system 110. Such dedicated interfaces 145 are generally employed when a convention or standard in the industry has converged on such an interface. The illustrated example of a Double Data Rate (DDR) interface 145 connecting the memory controller chiplet 140 to a dynamic random access memory (DRAM) memory device 150 is just such an industry convention.

Of the variety of possible support chiplets, the memory controller chiplet 140 is likely present in the chiplet system 110 due to the near omnipresent use of storage for computer processing as well as sophisticated state-of-the-art for memory devices. Thus, using memory device chiplets 150 and memory controller chiplets 140 produced by others gives chiplet system designers access to robust products by sophisticated producers. Generally, the memory controller chiplet 140 provides a memory device specific interface to read, write, or erase data. Often, the memory controller chiplet 140 can provide additional features, such as error detection, error correction, maintenance operations, or atomic operation execution. For some types of memory, maintenance operations tend to be specific to the memory device 150, such as garbage collection in NAND flash or storage class memories, temperature adjustments (e.g., cross temperature management) in NAND flash memories. In an example, the maintenance operations can include logical-to-physical (L2P) mapping or management to provide a level of indirection between the physical and logical representation of data. In other types of memory, for example DRAM, some memory operations, such as refresh may be controlled by a host processor or a memory controller at some times, and at other times controlled by the DRAM memory device, or by logic associated with one or more DRAM devices, such as an interface chip (in an example, a buffer).

Atomic operations are a data manipulation that, for example, may be performed by the memory controller chiplet 140. In other chiplet systems, the atomic operations may be performed by other chiplets. For example, an atomic operation of "increment" can be specified in a command by the application chiplet 125, the command including a memory address and possibly an increment value. Upon receiving the command, the memory controller chiplet 140 retrieves a number from the specified memory address, increments the number by the amount specified in the command, and stores the result. Upon a successful completion, the memory controller chiplet 140 provides an indication of the command's success to the application chiplet 125. Atomic operations avoid transmitting the data across the chiplet network 160, resulting in lower latency execution of such commands.

Atomic operations can be classified as built-in atomics or programmable (e.g., custom) atomics. Built-in atomics are a finite set of operations that are immutably implemented in hardware. Programmable atomics are small programs that can execute on a programmable atomic unit (PAU) (e.g., a custom atomic unit (CAU)) of the memory controller chiplet 140. FIG. 1 illustrates an example of a memory controller chiplet that discusses a PAU.

The memory device chiplet 150 can be, or include any combination of, volatile memory devices or non-volatile memories. Examples of volatile memory devices include, but are not limited to, random access memory (RAM)—such as DRAM, synchronous DRAM (SDRAM), graphics double data rate type 6 SDRAM (GDDR6 SDRAM), among others. Examples of non-volatile memory devices include, but are not limited to, negative-and-(NAND)-type flash memory, storage class memory (e.g., phase-change memory or memristor based technologies), ferroelectric RAM (FeRAM), among others. The illustrated example includes the memory device 150 as a chiplet, however, the memory device 150 can reside elsewhere, such as in a different package on the peripheral board 105. For many applications, multiple memory device chiplets may be provided. In an example, these memory device chiplets may each implement one or multiple storage technologies. In an example, a memory chiplet may include, multiple stacked memory die of different technologies, for example one or more SRAM devices stacked or otherwise in communication with one or more DRAM devices. Memory controller 140 may also serve to coordinate operations between multiple memory chiplets in chiplet system 110; for example, to utilize one or more memory chiplets in one or more levels of cache storage, and to use one or more additional memory chiplets as main memory. Chiplet system 110 may also include multiple memory controllers 140, as may be used to provide memory control functionality for separate processors, sensors, networks, etc. A chiplet architecture, such as chiplet system 110 offers advantages in allowing adaptation to different memory storage technologies; and different memory interfaces, through updated chiplet configurations, without requiring redesign of the remainder of the system structure.

Figure 2:
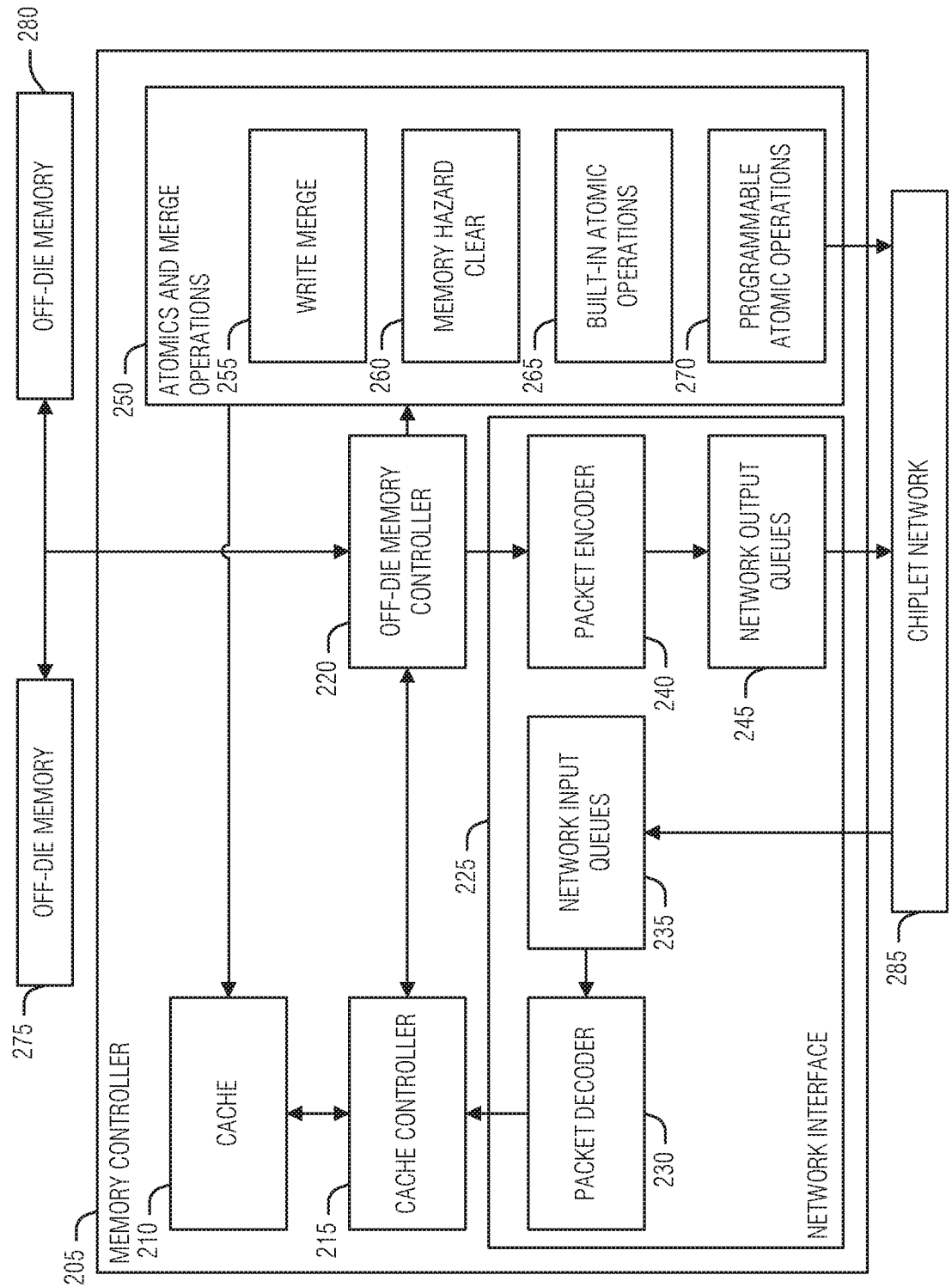
FIG. 2 illustrates components of an example of a memory controller chiplet, according to an embodiment.

FIG. 2 illustrates components of an example of a memory controller chiplet 205, according to an embodiment. The memory controller chiplet 205 includes a cache 210, a cache controller 215, an off-die memory controller 220 (e.g., to communicate with off-die memory 275), a network communication interface 225 (e.g., to interface with a chiplet network 285 and communicate with other chiplets), and a set of atomic and merge units 250. Members of this set can include, for example, a write merge unit 255, a memory hazard unit 260, built-in atomic unit 265, or a PAU 270. The various components are illustrated logically, and not as they necessarily would be implemented. For example, the built-in atomic unit 265 likely comprises different devices along a path to the off-die memory. For example, the built-in atomic unit 265 could be in an interface device/buffer on a memory chiplet, as discussed above. In contrast, the programmable atomic unit 270 could be implemented in a separate processor on the memory controller chiplet 205 (but in various examples may be implemented in other locations, for example on a memory chiplet).

The off-die memory controller 220 is directly coupled to the off-die memory 275 (e.g., via a bus or other communication connection) to provide write operations and read operations to and from the one or more off-die memory devices, such as off-die memory 275 and off-die memory 280. In the depicted example, the off-die memory controller 220 is also coupled for output to the atomic and merge unit 250, and for input to the cache controller 215 (e.g., a memory side cache controller).

In the example configuration, cache controller 215 is directly coupled to the cache 210, and may be coupled to the network communication interface 225 for input (such as incoming read or write requests), and coupled for output to the off-die memory controller 220.

The network communication interface 225 includes a packet decoder 230, network input queues 235, a packet encoder 240, and network output queues 245 to support a packet-based chiplet network 285, such as CPI. The chiplet network 285 can provide packet routing between and among processors, memory controllers, hybrid threading processors, configurable processing circuits, or communication interfaces. In such a packet-based communication system, each packet typically includes destination and source addressing, along with any data payload or instruction. In an example, the chiplet network 285 can be implemented as a collection of crossbar switches having a folded Clos configuration, or a mesh network providing for additional connections, depending upon the configuration.

In various examples, the chiplet network 285 can be part of an asynchronous switching fabric. Here, a data packet can be routed along any of various paths, such that the arrival of any selected data packet at an addressed destination can occur at any of multiple different times, depending upon the routing. Additionally, chiplet network 285 can be implemented at least in part as a synchronous communication network, such as a synchronous mesh communication network. Both configurations of communication networks are contemplated for use for examples in accordance with the present disclosure.

The memory controller chiplet 205 can receive a packet having, for example, a source address, a read request, and a physical address. In response, the off-die memory controller 220 or the cache controller 215 will read the data from the specified physical address (which can be in the off-die memory 275 or in the cache 210), and assemble a response packet to the source address containing the requested data. Similarly, the memory controller chiplet 205 can receive a packet having a source address, a write request, and a physical address. In response, the memory controller chiplet 205 will write the data to the specified physical address (which can be in the cache 210 or in the off-die memories 275 or 280), and assemble a response packet to the source address containing an acknowledgement that the data was stored to a memory.

Thus, the memory controller chiplet 205 can receive read and write requests via the chiplet network 285 and process the requests using the cache controller 215 interfacing with the cache 210, if possible. If the request cannot be handled by the cache controller 215, the off-die memory controller 220 handles the request by communication with the off-die memories 275 or 280, the atomic and merge unit 250, or both. As noted above, one or more levels of cache may also be implemented in off-die memories 275 or 280; and in some such examples may be accessed directly by cache controller 215. Data read by the off-die memory controller 220 can be cached in the cache 210 by the cache controller 215 for later use.

The atomic and merge unit 250 are coupled to receive (as input) the output of the off-die memory controller 220, and to provide output to the cache 210, the network communication interface 225, or directly to the chiplet network 285. The memory hazard unit 260, write merge unit 255 and the built-in (e.g., predetermined) atomic unit 265 can each be implemented as state machines with other combinational logic circuitry (such as adders, shifters, comparators, AND gates. OR gates, XOR gates, or any suitable combination thereof) or other logic circuitry. These components can also include one or more registers or buffers to store operand or other data. The PAU 270 can be implemented as one or more processor cores or control circuitry, and various state machines with other combinational logic circuitry or other logic circuitry, and can also include one or more registers, buffers, or memories to store addresses, executable instructions, operand and other data, or can be implemented as a processor.

The write merge unit 255 receives read data and request data, and merges the request data and read data to create a single unit having the read data and the source address to be used in the response or return data packet). The write merge unit 255 provides the merged data to the write port of the cache 210 (or, equivalently, to the cache controller 215 to write to the cache 210). Optionally, the write merge unit 255 provides the merged data to the network communication interface 225 to encode and prepare a response or return data packet for transmission on the chiplet network 285.

When the request data is for a built-in atomic operation, the built-in atomic unit 265 receives the request and reads data, either from the write merge unit 255 or directly from the off-die memory controller 220. The atomic operation is performed, and using the write merge unit 255, the resulting data is written to the cache 210, or provided to the network communication interface 225 to encode and prepare a response or return data packet for transmission on the chiplet network 285.

The built-in atomic unit 265 handles predefined atomic operations such as fetch-and-increment or compare-and-swap. In an example, these operations perform a simple read-modify-write operation to a single memory location of 32-bytes or less in size. Atomic memory operations are initiated from a request packet transmitted over the chiplet network 285. The request packet has a physical address, atomic operator type, operand size, and optionally up to 32-bytes of data. The atomic operation performs the read-modify-write to a cache memory line of the cache 210, filling the cache memory if necessary. The atomic operator response can be a simple completion response, or a response with up to 32-bytes of data. Example atomic memory operators include fetch-and-AND, fetch-and-OR, fetch-and-XOR, fetch-and-add, fetch-and-subtract, fetch-and-increment, fetch-and-decrement, fetch-and-minimum, fetch-and-maximum, fetch-and-swap, and compare-and-swap. In various example embodiments. 32-bit and 64-bit operations are supported, along with operations on 16 or 32 bytes of data. Methods disclosed herein are also compatible with hardware supporting larger or smaller operations and more or less data.

Built-in atomic operations can also involve requests for a "standard" atomic operation on the requested data, such as comparatively simple, single cycle, integer atomics—such as fetch-and-increment or compare-and-swap—which will occur with the same throughput as a regular memory read or write operation not involving an atomic operation. For these operations, the cache controller 215 may generally reserve a cache line in the cache 210 by setting a hazard bit (in hardware), so that the cache line cannot be read by another process while it is in transition. The data is obtained from either the off-die memory 275 or the cache 210, and is provided to the built-in atomic operation unit 265 to perform the requested atomic operation. Following the atomic operation, in addition to providing the resulting data to the packet encoder 240 to encode outgoing data packets for transmission on the chiplet network 285, the built-in atomic operation unit 265 provides the resulting data to the write merge unit 255, which will also write the resulting data to the cache 210. Following the writing of the resulting data to the cache 210, any corresponding hazard bit which was set will be cleared by the memory hazard unit 260.

The PAU 270 enables high performance (high throughput and low latency) for programmable atomic operations (also referred to as "custom atomic transactions" or "custom atomic operations"), comparable to the performance of built-in atomic operations. Rather than executing multiple memory accesses, in response to an atomic operation request designating a programmable atomic operation and a memory address, circuitry in the memory controller chiplet 205 transfers the atomic operation request to PAU 270 and sets a hazard bit stored in a memory hazard register corresponding to the memory address of the memory line used in the atomic operation, to ensure that no other operation (read, write, or atomic) is performed on that memory line, which hazard bit is then cleared upon completion of the atomic operation. Additional, direct data paths provided for the PAU 270 executing the programmable atomic operations allow for additional write operations without any limitations imposed by the bandwidth of the communication networks and without increasing any congestion of the communication networks.

The PAU 270 includes a multi-threaded processor, for example, such as a RISC-V ISA based multi-threaded processor, having one or more processor cores, and further having an extended instruction set for executing programmable atomic operations. When provided with the extended instruction set for executing programmable atomic operations, the PAU 270 can be embodied as one or more hybrid threading processors. In some example embodiments, the PAU 270 provides barrel-style, round-robin instantaneous thread switching to maintain a high instruction-per-clock rate.

Programmable atomic operations can be performed by the PAU 270 involving requests for a programmable atomic operation on the requested data. A user can prepare programming code to provide such programmable atomic operations. For example, the programmable atomic operations can be comparatively simple, multi-cycle operations such as floating-point addition, or comparatively complex, multi-instruction operations such as a Bloom filter insert. The programmable atomic operations can be the same as or different than the built-in atomic operations, insofar as they are defined by the user rather than a system vendor. For these operations, the cache controller 215 can reserve a cache line in the cache 210, by setting a hazard bit (in hardware), so that cache line cannot be read by another process while it is in transition. The data is obtained from either the cache 210 or the off-die memories 275 or 280, and is provided to the PAU 270 to perform the requested programmable atomic operation. Following the atomic operation, the PAU 270 will provide the resulting data to the network communication interface 225 to directly encode outgoing data packets having the resulting data for transmission on the chiplet network 285. In addition, the PAU 270 will provide the resulting data to the cache controller 215, which will also write the resulting data to the cache 210. Following the writing of the resulting data to the cache 210, any corresponding hazard bit which was set will be cleared by the cache control circuit 215.

In selected examples, the approach taken for programmable atomic operations is to provide multiple, generic, custom atomic request types that can be sent through the chiplet network 285 to the memory controller chiplet 205 from an originating source such as a processor or other system component. The cache controllers 215 or off-die memory controller 220 identify the request as a custom atomic and forward the request to the PAU 270. In a representative embodiment, the PAU 270: (1) is a programmable processing element capable of efficiently performing a user defined atomic operation; (2) can perform load and stores to memory, arithmetic and logical operations and control flow decisions; and (3) leverages the RISC-V ISA with a set of new, specialized instructions to facilitate interacting with such controllers 215, 220 to atomically perform the user-defined operation. In desirable examples, the RISC-V ISA contains a full set of instructions that support high level language operators and data types. The PAU 270 can leverage the RISC-V ISA, but will commonly support a more limited set of instructions and limited register file size to reduce the die size of the unit when included within the memory controller chiplet 205.

As mentioned above, prior to the writing of the read data to the cache 210, the set hazard bit for the reserved cache line is to be cleared, by the memory hazard clear unit 260. Accordingly, when the request and read data is received by the write merge unit 255, a reset or clear signal can be transmitted by the memory hazard clear unit 260 to the cache 210 to reset the set memory hazard bit for the reserved cache line. Also, resetting this hazard bit will also release a pending read or write request involving the designated (or reserved) cache line, providing the pending read or write request to an inbound request multiplexer for selection and processing.

Figure 3:
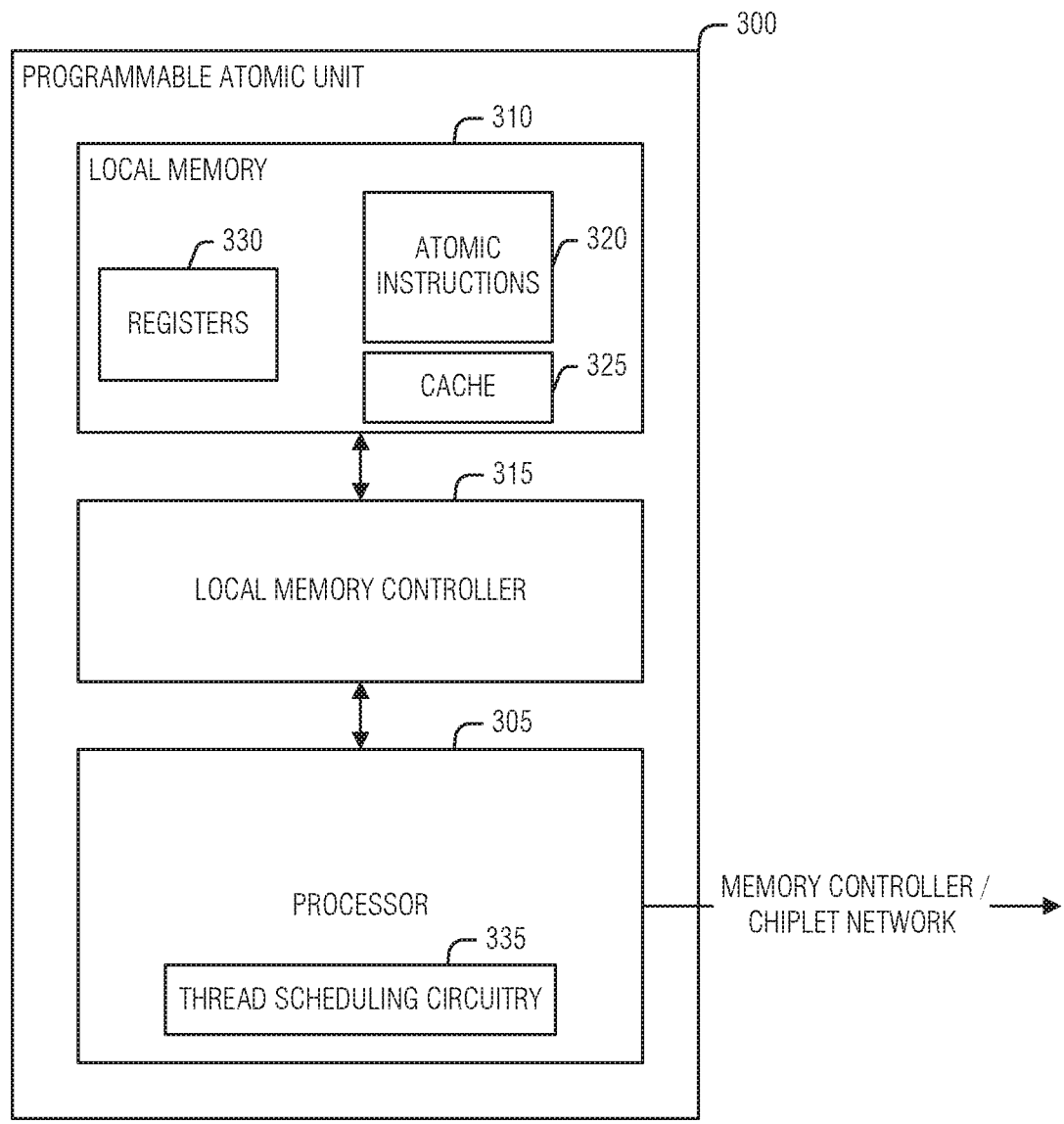
FIG. 3 illustrates components in an example of a programmable atomic unit (PAU), according to an embodiment.

FIG. 3 illustrates components in an example of a programmable atomic unit (PAU) 300, such as those noted above with respect to FIG. 1 (e.g., in the memory controller 140) and FIG. 2 (e.g., PAU 270), according to an embodiment. As illustrated, the PAU 300 includes a processor 305, local memory 310 (e.g., SRAM), and a controller 315 for the local memory 310. PAU 300 may interface with off-die memory controller 220, cache 210, or other portions of the memory controller chiplet 205 using chiplet interface line.

In an example, the processor 305 is a barrel processor, with circuitry to switch between different register files (e.g., sets of registers containing current processing state) upon each clock cycle of the processor 305. Although processor 305 is discussed herein in an example implementation in PAU 300 of a memory controller chiplet 205, the configuration and operation of processor 305 may also be used in other functions of memory controller chiplet 205 (for example, to perform built-in atomic operations), or may be used in a variety of other contexts, including but not limited to, in other chiplets of a chiplet system 110. This configuration of a barrel processor enables efficient context switching between currently executing threads. In an example, the processor 305 supports eight threads, resulting in eight register files. In an example, some or all of the register files 330 are not integrated into the processor 305, but rather reside in the local memory 310. This reduces circuit complexity in the processor 305 by eliminating the traditional flip-flops used for these registers.

Local memory 310 may include multiple memory devices. Memory devices may be of the same type, size, capacity, etc. For instance, local memory 310 may include an SRAM device for instruction RAM, which is accessed during an instruction fetch stage in a pipeline. Local memory 310 may also include separate SRAM devices for separate register files, which are accessed after an instruction decode stage, to read thread state during an execute stage in the pipeline, and to write results during a writeback stage in the pipeline. Local memory 310 may also include separate SRAM devices for separate data cache files, which may be used during memory access operations.

The local memory 310 can also house a cache and instructions for atomic operations 320. The atomic instructions 320 comprise sets of instructions to support the various application-loaded atomic operations. When an atomic operation is requested, e.g., by the application chiplet 125, a set of instructions corresponding to the atomic operation are executed by the processor 305. In an example, the instructions 320 reside in partitions of the local memory 310. In this example, the specific programmable atomic operation being requested by a requesting process can identify the programmable atomic operation by the partition number. The partition number can be established when the programmable atomic operation is registered with (e.g., loaded onto) the PAU 300. Additional metadata for the programmable atomic instructions, such as the partition tables, can also be stored in the local memory 310.

Atomic operations manipulate the cache 325, which is generally synchronized (e.g., flushed) when a thread for an atomic operation completes. Thus, aside from initial loading from the external memory, such as the off-die memory 275 or 280, latency is reduced for most memory operations during execution of a programmable atomic operation thread.

As noted above, when scheduling threads in a multi-threaded implementation in a barrel processor, such as the processor 305, if there is a single memory device (e.g., SRAM) for register files, there can be memory contention issues on the access ports to that memory. To address this situation, multiple memory devices are used and the processor 305 is configured with thread scheduling circuitry 335 to alternate between groups of threads, scheduling a thread from each group, with each group having its own memory device (e.g., registers 330) for register files.

The threads may be clustered together based on thread identifier or thread index. For instance, in an implementation that allows for up to eight threads to be serviced in a barrel processor, the threads may be indexed from 0 to 7. One group may contain threads of even index numbers, and the other group may contain threads of odd index numbers. As another example, one group may include thread indexes of 0 to 3 and the other group may include thread indexes of 4 to 7. As yet another example, the threads may be organized such that approximately half of the threads are in a first group and approximately half of the threads are in a second group, such that if threads with indexes of 0, 1, 4, 5, and 7 are operating, threads 0, 4 and 5 are in one group and threads 1 and 7 are in a second group. It is understood that the organization, grouping, ordering, or clustering of threads into groups described here is non-limiting and that any grouping may be used. Further, while two groups are discussed here, it is understood that more than two groups may be used in a given implementation.

In an example, the processor 305 is used for thread scheduling control and memory splitting in a barrel processor. Circuitry in the processor 305, such as a thread scheduling circuitry 335, is configured to place a thread to be scheduled in one of two groups: a first group and a second group. The first group is associated with a first processor storage device and the second group is associated with a second processor storage device. Intelligent scheduling that interleaves instructions from the two groups ensures that instructions in one group do not attempt to read from a register file and write to the register file in the same clock cycle. In other words, the groups are organized such that instructions of threads in the first group do not have a read and a write to a first processor storage device on a first clock cycle, and instructions of threads in the second group do not have a read and a write to a second processor storage device on a second clock cycle, where the second clock cycle is adjacent to the first clock cycle.

In an embodiment, the first processor storage device is configured to store a first register file for threads in the first group, and the second processor storage device is configured to store a second register file for threads in the second group.

In an embodiment, the thread scheduling circuitry 335 is integrated in the barrel processor 305, the barrel processor 305 is included in a programmable atomic unit 270, and the programmable atomic unit 270 is included in a memory controller 205. In a further embodiment, the memory controller 205 is a chiplet in a chiplet system 110.

The processor 305, implementing the thread scheduling circuitry 335, is configured to schedule a current thread to place into a pipeline for the barrel processor, the scheduling performed by alternating between threads in the first group and threads in the second group.

In an embodiment, the threads from the first group and the threads from the second group are scheduled to execute every other clock cycle.

In an embodiment, the instructions of threads in the first group have alternating reads and writes to the first processor storage device on successive clock cycles. In a further embodiment, the instructions of threads in the second group have alternating reads and writes to the second processor storage device on successive clock cycles. In another embodiment, the first processor storage device includes only two access ports, and alternating the reads and writes on successive clock cycles removes contention from the only two access ports.

In a related embodiment, the first processor storage device includes only two access ports. In a further embodiment, the second processor storage device includes only two access ports (e.g., SRAM).

In an embodiment, the first processor storage device is a register. In another embodiment, the first processor storage device is a local random-access memory of the barrel processor. In such an embodiment, the threads from the first group read from a register file that is stored in the local random-access memory of the barrel processor. In a related embodiment, the threads from the first group write to the register file that is stored in the local random-access memory of the barrel processor.

Figure 4:
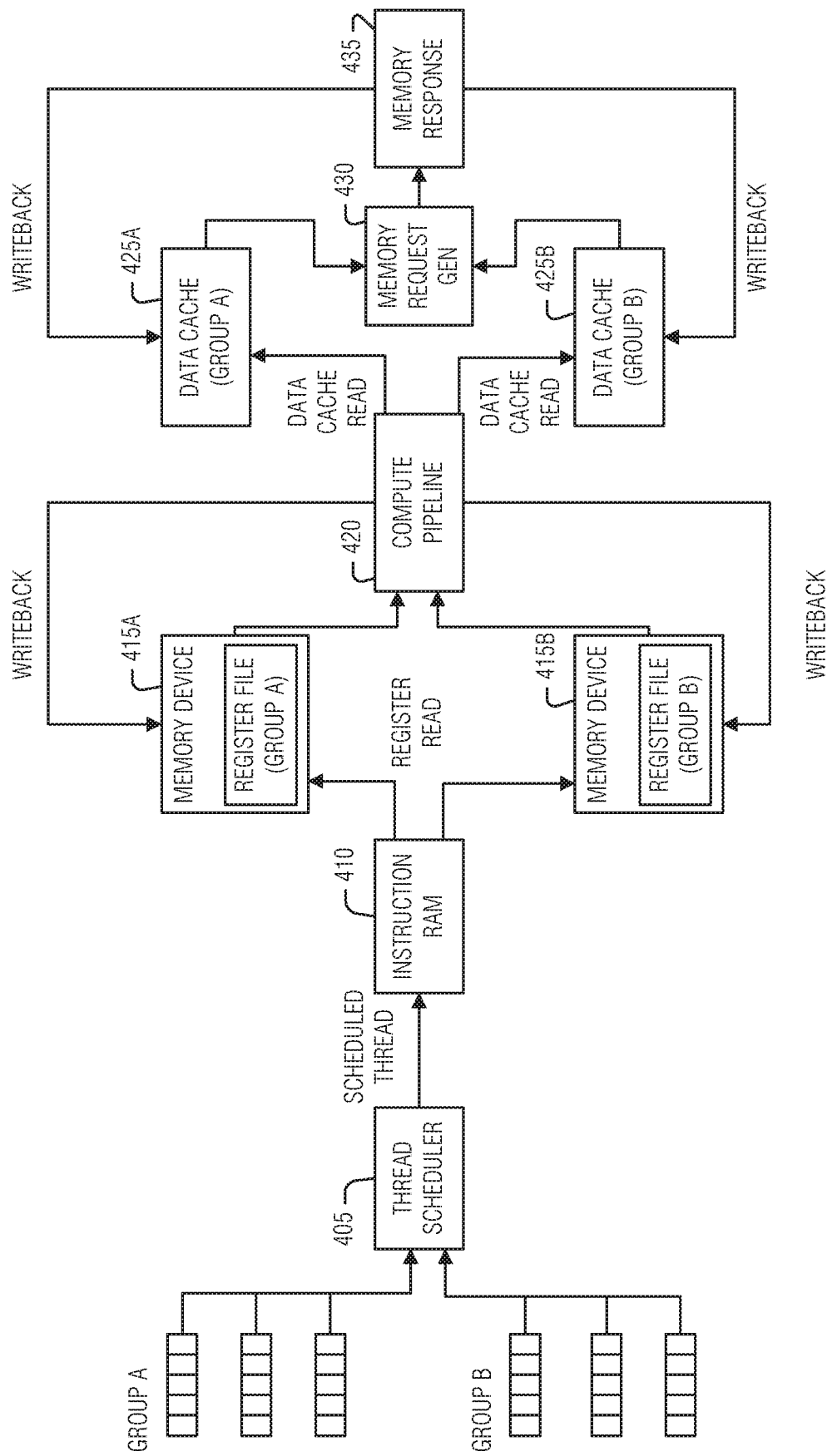
FIG. 4 is a block diagram illustrating control and data flow in a pipeline, according to an embodiment.

FIG. 4 is a block diagram illustrating control and data flow in a pipeline, according to an embodiment. In particular. FIG. 4 illustrates parts of a pipeline of a processor, such as processor 305. Threads are organized into two groups: Group A and Group B. The threads in each group include one or more operations that are queued up for scheduling. A thread scheduler 405 alternates between Group A and Group B and schedules thread operations from each group.

At the beginning of the pipeline, the thread is inserted into the compute pipeline by the thread scheduler 405. The thread's instruction is read from instruction RAM 410 and decoded into appropriate control signals for a compute pipeline 420. Up to two of these control signals are source register addresses. The compute pipeline 420, depending on the decoded instruction, may read up to two registers from processor storage device A 415A or processor storage device B 415B, whichever corresponds to the group that was scheduled by the thread scheduler 405—threads from Group A read and write to processor storage device A 415A and threads from Group B read and write to processor storage device B 415B.

A register file from the processor storage device (415A or 415B) is read from up to both available memory access ports to obtain register data for the thread, which is used in the later stages of the compute pipeline 420. Resultant data is written back to the register file in the corresponding processor storage device (415A or 415B) out of the compute pipeline 420.

Additional memory operations may be performed downstream of the compute pipeline 420, such as a data cache read/write operation 425A and 425B, a memory request generation operation 430, and a memory response operation 435 to writeback the result of a memory request to the data cache.

As with the register files, which are separated onto distinct memory devices 415A and 415B, the data cache 425A and 425B may also be separated onto several memory devices. Data cache 425A and 425B may be implemented as two files each on its own memory device (e.g., SRAM). Splitting the data cache across distinct memory devices addresses contention issues, just like splitting the register files across processor storage devices 415A and 415B.

Figure 5:
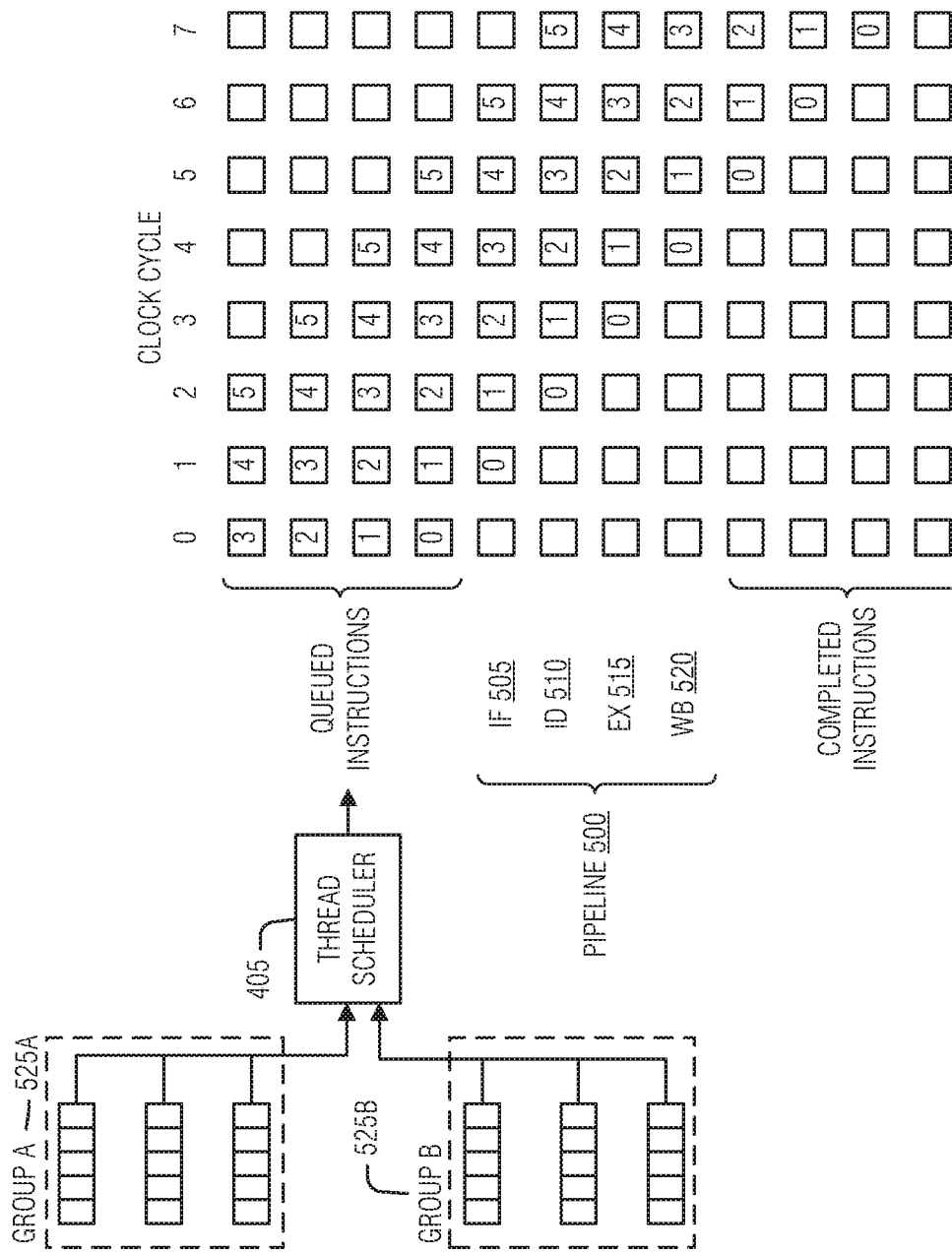
FIG. 5 is a timing sequence diagram illustrating an example of pipeline stages over time, according to an embodiment

FIG. 5 is a timing sequence diagram illustrating an example of pipeline stages 500 over time, according to an embodiment. A pipelined processor can typically be thought of as having distinct activities, which may correspond to distinct hardware for each activity. In the example illustrated in FIG. 5, the activities in the pipeline 500 include an instruction fetch (IF) stage 505, instruction decode (ID) stage 510, execution (EX) stage 515, and writeback (WB) stage 520. More or fewer stages may be used in alternative implementations. Use of pipeline stalls, no operations (NOPs), or other delays may be used to adjust timing when a certain number of stages are used in relation to the number of groups available for the scheduler to alternate between.

At clock cycle 0, six instructions are ready to be inserted into the pipeline. The instructions are from Group A 525A and Group B 525B. The groups 525A and 525B include threads of even and odd indexes. This is useful for illustration, but it is understood that other groupings may be used to form groups 525A and 525B. For instance, the threads may be randomly assigned to the groups, there may be a prioritization scheme used to assign threads to groups, or the threads may be arbitrarily assigned to one of the groups.

Here, using even and odd indexes to create the groups, the four instructions ready to be inserted into the pipeline include instructions corresponding to thread indexes 0, 1, 2, 3, 4, and 5. Thread indexes 0, 2, and 4 are in Group A 525A (the "even group"), and thread indexes 1, 3, and 5 are in Group B 525B (the "odd group").

At clock cycle 1, thread 0 is inserted into the pipeline 500 by the thread scheduler 405. The current instruction associated with thread 0 is read from the instruction RAM 410 in the IF stage 505.

At clock cycle 2, thread 1 is inserted into the pipeline by the thread scheduler 405. The current instruction associated with thread 1 is read from the instruction RAM 410 in the IF stage 505. Thread 0 progresses to the ID stage 510, where the instruction is decoded into various control signals.

At clock cycle 3, thread 2 is inserted into the pipeline by the thread scheduler 405. The current instruction associated with thread 2 is read from the instruction RAM 410 in the IF stage 505. Thread 1 progresses to the ID stage 510, where the instruction is decoded into various control signals. Thread 0 progresses to the EX stage 515, where up to two registers are read from processor storage device A (e.g. processor storage device 415A), and the decoded instruction associated with thread 0 is executed.

At clock cycle 4, thread 3 is inserted into the pipeline by the thread scheduler 405. The current instruction associated with thread 3 is read from the instruction RAM 410 in the IF stage 505. Thread 2 progresses to the ID stage 510, where the instruction is decoded into various control signals. Thread 1 progresses to the EX stage 515, where up to two registers are read from processor storage device B (e.g. processor storage device 415B), and the decoded instruction associated with thread 1 is executed. Thread 0 progresses to the WB stage 520, where data is potentially written back into the processor storage device A (e.g. processor storage device 415A).

At clock cycle 5, thread 4 is inserted into the pipeline by the thread scheduler 405. The current instruction associated with thread 4 is read from the instruction RAM 410 in the IF stage 505. Thread 3 progresses to the ID stage 510, where the instruction is decoded into various control signals. Thread 2 progresses to the EX stage 515, where up to two registers are read from processor storage device A (e.g.

processor storage device 415A), and the decoded instruction associated with thread 2 is executed. Thread 1 progresses to the WB stage 520, where data is potentially written back into the processor storage device B (e.g. processor storage device 415B). Thread 0 exits the pipeline.

At clock cycle 6, thread 5 is inserted into the pipeline by the thread scheduler 405. The current instruction associated with thread 5 is read from the instruction RAM 410 in the IF stage 505. Thread 4 progresses to the ID stage 510, where the instruction is decoded into various control signals. Thread 3 progresses to the EX stage 515, where up to two registers are read from processor storage device B (e.g. processor storage device 415B), and the decoded instruction associated with thread 3 is executed. Thread 2 progresses to the WB stage 520, where data is potentially written back into the processor storage device A (e.g. processor storage device 415A). Thread 1 exits the pipeline. The pipeline processing continues in this fashion until all thread instructions are completed.

As can be observed from this example, accesses to the processor storage device A alternate every other cycle. In particular, it is read at clock cycle 3 by thread 0, written at clock cycle 4 by thread 0, read at clock cycle 5 by thread 2, written at clock cycle 6 by thread 2, etc. Similarly, accesses to processor storage device B alternate every other cycle by threads 1, 3, and 5. The use of multiple processor storage devices and alternating scheduling has eliminated memory contention on the access ports to the storage devices.

Figure 6:
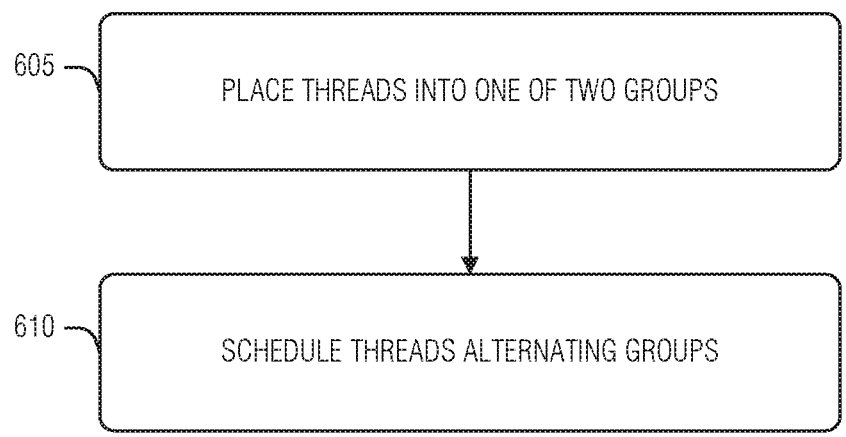
FIG. 6 is a flow chart of an example of a method for thread scheduling control and memory splitting in a barrel processor, according to an embodiment.
Figure 7:
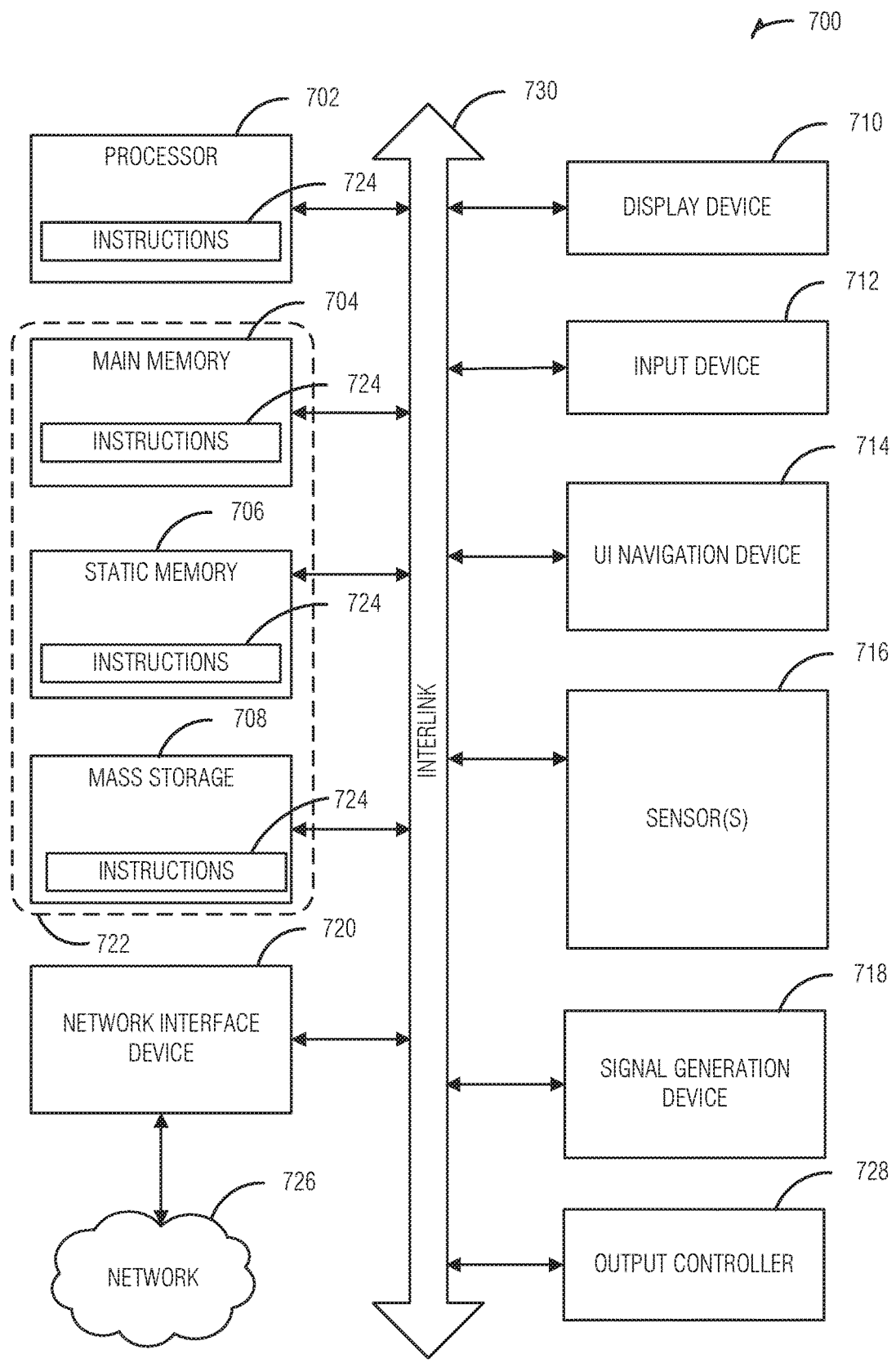
FIG. 7 is a block diagram of an example of a machine with which, in which, or by which embodiments of the present disclosure can operate.

FIG. 6 is a flow chart of an example of a method 600 for thread execution control in a barrel processor, according to an embodiment. Operations of the method 600 are performed by computer hardware, such as that described with respect to FIGS. 1A-1B (e.g., memory controller chiplet), FIG. 2. FIG. 3, or FIG. 7 (e.g., processing circuitry).

At 605, a thread to be scheduled is placed by a thread scheduling circuit in one of two groups: a first group and a second group. The first group is associated with a first processor storage device and the second group is associated with a second processor storage device. The groups are organized such that instructions of threads in the first group do not have a read and a write to a first processor storage device on a first clock cycle, and instructions of threads in the second group do not have a read and a write to a second processor storage device on a second clock cycle, where the second clock cycle is adjacent to the first clock cycle. In an embodiment, the first processor storage device is configured to store a first register file for threads in the first group, and the second processor storage device is configured to store a second register file for threads in the second group.

At 610, a current thread to place into a pipeline for the barrel processor is scheduled by the thread scheduling circuit, the scheduling performed by alternating between threads in the first group and threads in the second group.

In an embodiment, the threads from the first group and the threads from the second group are scheduled to execute every other clock cycle.

In an embodiment, the instructions of threads in the first group have alternating reads and writes to the first processor storage device on successive clock cycles. In a further embodiment, the instructions of threads in the second group have alternating reads and writes to the second processor storage device on successive clock cycles. In another embodiment, the first processor storage device includes only two access ports, and alternating the reads and writes on successive clock cycles removes contention from the only two access ports.

In a related embodiment, the first processor storage device includes only two access ports. In a further embodiment, the second processor storage device includes only two access ports (e.g., SRAM).

In an embodiment, the first processor storage device is a local random-access memory of the barrel processor. In such an embodiment, the threads from the first group read from a register file that is stored in the local random-access memory of the barrel processor. In a related embodiment, the threads from the first group write to the register file that is stored in the local random-access memory of the barrel processor.

In an embodiment, the thread scheduling circuitry is integrated in the barrel processor, the barrel processor is included in a programmable atomic unit, and the programmable atomic unit is included in a memory controller. In a further embodiment, the memory controller is a chiplet in a chiplet system, such as chiplet system 110.

FIG. 7 illustrates a block diagram of an example machine 700 with which, in which, or by which any one or more of the techniques (e.g., methodologies) discussed herein can be implemented. Examples, as described herein, can include, or can operate by, logic or a number of components, or mechanisms in the machine 700. Selected components of example machine 700 may be implemented in a chiplet-based system is described earlier herein. For example, memory controller functionality as described herein may be implemented as a portion of processor 702, or as a portion of main memory 704; and in some examples, the memory controller functionality may be on a dedicated memory controller chiplet in operational communication with one or more memory devices constituting main memory of system 700. Circuitry (e.g., processing circuitry) is a collection of circuits implemented in tangible entities of the machine 700 that include hardware (e.g., simple circuits, gates, logic, etc.). Circuitry membership can be flexible over time. Circuitries include members that can, alone or in combination, perform specified operations when operating; thus processing circuitry in various instances, for example in various controllers as described in the specification, can include one or more processors, or cores of processors, or other instruction-executing devices. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time. Additional examples of these components with respect to the machine 700 follow.

In alternative embodiments, the machine 700 can operate as a standalone device or can be connected (e.g., networked) to other machines. In a networked deployment, the machine 700 can operate in the capacity of a server machine, a client machine, or both in server-client network environments. In an example, the machine 700 can act as a peer machine in peer-to-peer (P2P) (or other distributed) network environment. The machine 700 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 700 can include a hardware processor 702 (e.g., a central processing unit (CPU), a graphics processing unit (GPU), a hardware processor core, or any combination thereof), a main memory 704, a static memory (e.g., memory or storage for firmware, microcode, a basic-input-output (BIOS), unified extensible firmware interface (UEFI), etc.) 706, and mass storage 708 (e.g., hard drives, tape drives, flash storage, or other block devices) some or all of which can communicate with each other via an interlink (e.g., bus) 730. The machine 700 can further include a display unit 710, an alphanumeric input device 712 (e.g., a keyboard), and a user interface (UI) navigation device 714 (e.g., a mouse). In an example, the display unit 710, input device 712 and UI navigation device 714 can be a touch screen display. The machine 700 can additionally include a storage device (e.g., drive unit) 708, a signal generation device 718 (e.g., a speaker), a network interface device 720, and one or more sensors 716, such as a global positioning system (GPS) sensor, compass, accelerometer, or other sensor. The machine 700 can include an output controller 728, such as a serial (e.g., universal serial bus (USB)), parallel, or other wired or wireless (e.g., infrared (IR), near field communication (NFC), etc.) connection to communicate or control one or more peripheral devices (e.g., a printer, card reader, etc.).

Registers of the processor 702, the main memory 704, the static memory 706, or the mass storage 708 can be, or include, a machine readable medium 722 on which is stored one or more sets of data structures or instructions 724 (e.g., software) embodying or utilized by any one or more of the techniques or functions described herein. The instructions 724 can also reside, completely or at least partially, within any of registers of the processor 702, the main memory 704, the static memory 706, or the mass storage 708 during execution thereof by the machine 700. In an example, one or any combination of the hardware processor 702, the main memory 704, the static memory 706, or the mass storage 708 can constitute the machine readable media 722. While the machine readable medium 722 is illustrated as a single medium, the term "machine readable medium" can include a single medium or multiple media (e.g., a centralized or distributed database, or associated caches and servers) configured to store the one or more instructions 724.

The term "machine readable medium" can include any medium that is capable of storing, encoding, or carrying instructions for execution by the machine 700 and that cause the machine 700 to perform any one or more of the techniques of the present disclosure, or that is capable of storing, encoding or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media can include: non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks: and CD-ROM and DVD-ROM disks.

In an example, information stored or otherwise provided on the machine readable medium 722 can be representative of the instructions 724, such as instructions 724 themselves or a format from which the instructions 724 can be derived. This format from which the instructions 724 can be derived can include source code, encoded instructions (e.g., in compressed or encrypted form), packaged instructions (e.g., split into multiple packages), or the like. The information representative of the instructions 724 in the machine readable medium 722 can be processed by processing circuitry into the instructions to implement any of the operations discussed herein. For example, deriving the instructions 724 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 724.

In an example, the derivation of the instructions 724 can include assembly, compilation, or interpretation of the information (e.g., by the processing circuitry) to create the instructions 724 from some intermediate or preprocessed format provided by the machine readable medium 722. The information, when provided in multiple parts, can be combined, unpacked, and modified to create the instructions 724. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 724 can be further transmitted or received over a communications network 726 using a transmission medium via the network interface device 720 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®). IEEE 802.15.4 family of standards, peer-to-peer (P2P) networks, among others. In an example, the network interface device 720 can include one or more physical jacks (e.g., Ethernet, coaxial, or phone jacks) or one or more antennas to connect to the communications network 726. In an example, the network interface device 720 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 700, and includes digital or analog communications signals or other intangible medium to facilitate communication of such software. A transmission medium is a machine readable medium. To better illustrate the methods and apparatuses described herein, a non-limiting set of Example embodiments are set forth below as numerically identified Examples.

Example 1 is an apparatus, comprising: a barrel processor, comprising: thread scheduling circuitry; wherein the barrel processor is configured to perform operations through use of the thread scheduling circuitry, the operations including those to: place a thread to be scheduled in one of two groups: a first group and a second group, wherein the first group is associated with a first processor storage device, and the second group is associated with a second processor storage device; and schedule a current thread to place into a pipeline for the barrel processor, the scheduling performed by alternating between threads in the first group and threads in the second group.

In Example 2, the subject matter of Example 1 includes, wherein the threads from the first group and the threads from the second group are scheduled to execute every other clock cycle.

In Example 3, the subject matter of Examples 1-2 includes, wherein the instructions of threads in the first group have alternating reads and writes to the first processor storage device on successive clock cycles.

In Example 4, the subject matter of Example 3 includes, wherein the instructions of threads in the second group have alternating reads and writes to the second processor storage device on successive clock cycles.

In Example 5, the subject matter of Examples 3-4 includes, wherein the first processor storage device includes only two access ports, and wherein the alternating reads and writes on successive clock cycles removes contention from the only two access ports.

In Example 6, the subject matter of Examples 1-5 includes, wherein the first processor storage device includes only two access ports.

In Example 7, the subject matter of Example 6 includes, wherein the second processor storage device includes only two access ports.

In Example 8, the subject matter of Examples 1-7 includes, wherein the first processor storage device is a local random-access memory of the barrel processor.

In Example 9, the subject matter of Example 8 includes, wherein the threads from the first group read from a register file that is stored in the local random-access memory of the barrel processor.

In Example 10, the subject matter of Examples 8-9 includes, wherein the threads from the first group write to the register file that is stored in the local random-access memory of the barrel processor.

In Example 11, the subject matter of Examples 1-10 includes, wherein the first processor storage device is configured to store a first register file for threads in the first group, and the second processor storage device is configured to store a second register file for threads in the second group.

In Example 12, the subject matter of Examples 1-11 includes, wherein the thread scheduling circuitry is integrated in the barrel processor, the barrel processor included in a programmable atomic unit, and the programmable atomic unit is included in a memory controller.

In Example 13, the subject matter of Example 12 includes, wherein the memory controller is a chiplet in a chiplet system.

Example 14 is a method, comprising: placing, by a barrel processor including thread scheduling circuitry, a thread to be scheduled in one of two groups: a first group and a second group, wherein the first group is associated with a first processor storage device, and the second group is associated with a second processor storage device; and scheduling, by the barrel processor including thread scheduling circuitry, a current thread to place into a pipeline for the barrel processor, the scheduling performed by alternating between threads in the first group and threads in the second group.

In Example 15, the subject matter of Example 14 includes, wherein the threads from the first group and the threads from the second group are scheduled to execute every other clock cycle.

In Example 16, the subject matter of Examples 14-15 includes, wherein the instructions of threads in the first group have alternating reads and writes to the first processor storage device on successive clock cycles.

In Example 17, the subject matter of Example 16 includes, wherein the instructions of threads in the second group have alternating reads and writes to the second processor storage device on successive clock cycles.

In Example 18, the subject matter of Examples 16-17 includes, wherein the first processor storage device includes only two access ports, and wherein the alternating reads and writes on successive clock cycles removes contention from the only two access ports.

In Example 19, the subject matter of Examples 14-18 includes, wherein the first processor storage device includes only two access ports.

In Example 20, the subject matter of Example 19 includes, wherein the second processor storage device includes only two access ports.

In Example 21, the subject matter of Examples 14-20 includes, wherein the first processor storage device is a local random-access memory of the barrel processor.

In Example 22, the subject matter of Example 21 includes, wherein the threads from the first group read from a register file that is stored in the local random-access memory of the barrel processor.

In Example 23, the subject matter of Examples 21-22 includes, wherein the threads from the first group write to the register file that is stored in the local random-access memory of the barrel processor.

In Example 24, the subject matter of Examples 14-23 includes, wherein the first processor storage device is configured to store a first register file for threads in the first group, and the second processor storage device is configured to store a second register file for threads in the second group.

In Example 25, the subject matter of Examples 14-24 includes, wherein the thread scheduling circuitry is integrated in the barrel processor, the barrel processor included in a programmable atomic unit, and the programmable atomic unit is included in a memory controller.

In Example 26, the subject matter of Example 25 includes, wherein the memory controller is a chiplet in a chiplet system.

Example 27 is a machine-readable medium including instructions, which when executed by a barrel processor having thread scheduling circuitry, cause the barrel processor to: place a thread to be scheduled in one of two groups: a first group and a second group, wherein the first group is associated with a first processor storage device, and the second group is associated with a second processor storage device; and schedule a current thread to place into a pipeline for the barrel processor, the scheduling performed by alternating between threads in the first group and threads in the second group.

In Example 28, the subject matter of Example 27 includes, wherein the threads from the first group and the threads from the second group are scheduled to execute every other clock cycle.

In Example 29, the subject matter of Examples 27-28 includes, wherein the instructions of threads in the first group have alternating reads and writes to the first processor storage device on successive clock cycles.

In Example 30, the subject matter of Example 29 includes, wherein the instructions of threads in the second group have alternating reads and writes to the second processor storage device on successive clock cycles.

In Example 31, the subject matter of Examples 29-30 includes, wherein the first processor storage device includes only two access ports, and wherein the alternating reads and writes on successive clock cycles removes contention from the only two access ports.

In Example 32, the subject matter of Examples 27-31 includes, wherein the first processor storage device includes only two access ports.

In Example 33, the subject matter of Example 32 includes, wherein the second processor storage device includes only two access ports.

In Example 34, the subject matter of Examples 27-33 includes, wherein the first processor storage device is a local random-access memory of the barrel processor.

In Example 35, the subject matter of Example 34 includes, wherein the threads from the first group read from a register file that is stored in the local random-access memory of the barrel processor.

In Example 36, the subject matter of Examples 34-35 includes, wherein the threads from the first group write to the register file that is stored in the local random-access memory of the barrel processor.

In Example 37, the subject matter of Examples 27-36 includes, wherein the first processor storage device is configured to store a first register file for threads in the first group, and the second processor storage device is configured to store a second register file for threads in the second group.

In Example 38, the subject matter of Examples 27-37 includes, wherein the thread scheduling circuitry is integrated in the barrel processor, the barrel processor included in a programmable atomic unit, and the programmable atomic unit is included in a memory controller.

In Example 39, the subject matter of Example 38 includes, wherein the memory controller is a chiplet in a chiplet system.

Example 40 is an apparatus, the apparatus comprising: means for placing, by a barrel processor having a thread scheduling circuit, a thread to be scheduled in one of two groups: a first group and a second group, wherein the first group is associated with a first processor storage device, and the second group is associated with a second processor storage device; and means for scheduling, by the barrel processor having the thread scheduling circuit, a current thread to place into a pipeline for the barrel processor, the scheduling performed by alternating between threads in the first group and threads in the second group.

In Example 41, the subject matter of Example 40 includes, wherein the threads from the first group and the threads from the second group are scheduled to execute every other clock cycle.

In Example 42, the subject matter of Examples 40-41 includes, wherein the instructions of threads in the first group have alternating reads and writes to the first processor storage device on successive clock cycles.

In Example 43, the subject matter of Example 42 includes, wherein the instructions of threads in the second group have alternating reads and writes to the second processor storage device on successive clock cycles.

In Example 44, the subject matter of Examples 42-43 includes, wherein the first processor storage device includes only two access ports, and wherein the alternating reads and writes on successive clock cycles removes contention from the only two access ports.

In Example 45, the subject matter of Examples 40-44 includes, wherein the first processor storage device includes only two access ports.

In Example 46, the subject matter of Example 45 includes, wherein the second processor storage device includes only two access ports.

In Example 47, the subject matter of Examples 40-46 includes, wherein the first processor storage device is a local random-access memory of the barrel processor.

In Example 48, the subject matter of Example 47 includes, wherein the threads from the first group read from a register file that is stored in the local random-access memory of the barrel processor.

In Example 49, the subject matter of Examples 47-48 includes, wherein the threads from the first group write to the register file that is stored in the local random-access memory of the barrel processor.

In Example 50, the subject matter of Examples 40-49 includes, wherein the first processor storage device is configured to store a first register file for threads in the first group, and the second processor storage device is configured to store a second register file for threads in the second group.

In Example 51, the subject matter of Examples 40-50 includes, wherein the thread scheduling circuitry is integrated in the barrel processor, the barrel processor included in a programmable atomic unit, and the programmable atomic unit is included in a memory controller.

In Example 52, the subject matter of Example 51 includes, wherein the memory controller is a chiplet in a chiplet system.

Example 53 is an apparatus, comprising: a memory controller chiplet in a chiplet system, the memory controller chiplet comprising: a programmable atomic unit, the programmable atomic unit comprising: a barrel processor, the barrel processor comprising: thread scheduling circuitry; wherein the barrel processor is configured to perform operations through use of the thread scheduling circuitry, the operations including: placing a thread to be scheduled in one of two groups: a first group and a second group, wherein the first group is associated with a first processor storage device, and the second group is associated with a second processor storage device; and scheduling a current thread to place into a pipeline for the barrel processor, the scheduling performed by alternating between threads in the first group and threads in the second group.

In Example 54, the subject matter of Example 53 includes, wherein the threads from the first group and the threads from the second group are scheduled to execute every other clock cycle.

In Example 55, the subject matter of Examples 53-54 includes, wherein the instructions of threads in the first group have alternating reads and writes to the first processor storage device on successive clock cycles.

In Example 56, the subject matter of Example 55 includes, wherein the instructions of threads in the second group have alternating reads and writes to the second processor storage device on successive clock cycles.

In Example 57, the subject matter of Examples 55-56 includes, wherein the first processor storage device includes only two access ports, and wherein the alternating reads and writes on successive clock cycles removes contention from the only two access ports.

In Example 58, the subject matter of Examples 53-57 includes, wherein the first processor storage device includes only two access ports.

In Example 59, the subject matter of Example 58 includes, wherein the second processor storage device includes only two access ports.

In Example 60, the subject matter of Examples 53-59 includes, wherein the first processor storage device is a local random-access memory of the barrel processor.

In Example 61, the subject matter of Example 60 includes, wherein the threads from the first group read from a register file that is stored in the local random-access memory of the barrel processor.

In Example 62, the subject matter of Examples 60-61 includes, wherein the threads from the first group write to the register file that is stored in the local random-access memory of the barrel processor.

In Example 63, the subject matter of Examples 53-62 includes, wherein the first processor storage device is configured to store a first register file for threads in the first group, and the second processor storage device is configured to store a second register file for threads in the second group.

Example 64 is at least one machine-readable medium including instructions that, when executed by processing circuitry, cause the processing circuitry to perform operations to implement of any of Examples 1-63.

Example 65 is an apparatus comprising means to implement of any of Examples 1-63.

Example 66 is a system to implement of any of Examples 1-63.

Example 67 is a method to implement of any of Examples 1-63.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B." unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus, comprising:
   a barrel processor, comprising:
      thread scheduling circuitry;
      wherein the barrel processor is configured to perform operations through use of the thread scheduling circuitry, the operations including those to:
         place a thread to be scheduled in one of two groups by assigning an index to the thread that corresponds to the one of the two groups:
            a first group and a second group, wherein the first group is associated with a first processor storage device and has a first set of indexes, and the second group is associated with a second processor storage device and has a second set of indexes; and
            wherein threads are selected to be in the first group based on having instructions with alternating reads and writes to the first processor storage device such that two threads in the first group do not have a read and a write to the first processor storage device on a same clock cycle to remove contention between the instructions to access ports to the first processor storage device; and
         schedule a current thread to place into a pipeline for the barrel processor, the scheduling performed by alternating between threads in the first group and threads in the second group.

2. The apparatus of claim 1, wherein the threads from the first group and the threads from the second group are scheduled to execute every other clock cycle.

3. The apparatus of claim 1, wherein the instructions of the threads in the first group have the alternating reads and writes to the first processor storage device on successive clock cycles.

4. The apparatus of claim 3, wherein the instructions of threads in the second group have alternating reads and writes to the second processor storage device on the successive clock cycles.

5. The apparatus of claim 3, wherein the first processor storage device includes only two access ports.

6. The apparatus of claim 1, wherein the first processor storage device includes only two access ports.

7. The apparatus of claim 6, wherein the second processor storage device includes only two access ports.

8. The apparatus of claim 1, wherein the first processor storage device is a local random-access memory of the barrel processor.

9. The apparatus of claim 8, wherein the threads from the first group read from a register file that is stored in the local random-access memory of the barrel processor.

10. The apparatus of claim 8, wherein the threads from the first group write to a register file that is stored in the local random-access memory of the barrel processor.

11. The apparatus of claim 1, wherein the first processor storage device is configured to store a first register file for threads in the first group, and the second processor storage device is configured to store a second register file for threads in the second group.

12. The apparatus of claim 1, wherein the thread scheduling circuitry is integrated in the barrel processor, the barrel processor included in a programmable atomic unit, and the programmable atomic unit is included in a memory controller.

13. The apparatus of claim 12, wherein the memory controller is a chiplet in a chiplet system.

14. A method, comprising:
placing, by a barrel processor including thread scheduling circuitry, a thread to be scheduled in one of two groups by assigning an index to the thread that corresponds to the one of the two groups: a first group and a second group, wherein the first group is associated with a first processor storage device and has a first set of indexes, and the second group is associated with a second processor storage device and has a second set of indexes; and wherein threads are selected to be in the first group based on having instructions with alternating reads and writes to the first processor storage device such that two threads in the first group do not have a read and a write to the first processor storage device on a same clock cycle to remove contention between the instructions to access ports to the first processor storage device; and
scheduling, by the barrel processor including thread scheduling circuitry, a current thread to place into a pipeline for the barrel processor, the scheduling performed by alternating between threads in the first group and threads in the second group.

15. The method of claim 14, wherein the threads from the first group and the threads from the second group are scheduled to execute every other clock cycle.

16. The method of claim 14, wherein the instructions of the threads in the first group have the alternating reads and writes to the first processor storage device on successive clock cycles.

17. The method of claim 16, wherein the instructions of threads in the second group have alternating reads and writes to the second processor storage device on the successive clock cycles.

18. The method of claim 16, wherein the first processor storage device includes only two access ports.

19. The method of claim 14, wherein the first processor storage device includes only two access ports.

20. The method of claim 19, wherein the second processor storage device includes only two access ports.

21. An apparatus, comprising:
a memory controller chiplet in a chiplet system, the memory controller chiplet comprising:
a programmable atomic unit, the programmable atomic unit comprising:
a barrel processor, the barrel processor comprising:
thread scheduling circuitry;
wherein the barrel processor is configured to perform operations through use of the thread scheduling circuitry, the operations including:
placing a thread to be scheduled in one of two groups by assigning an index to the thread that corresponds to the one of the two groups:
a first group and a second group, wherein the first group is associated with a first processor storage device and has a first set of indexes, and the second group is associated with a second processor storage device and has a second set of indexes; and
wherein threads are selected to be in the first group based on having instructions with alternating reads and writes to the first processor storage device such that two threads in the first group do not have a read and a write to the first processor storage device on a same clock cycle to remove contention between the instructions to access ports to the first processor storage device; and
scheduling a current thread to place into a pipeline for the barrel processor, the scheduling performed by alternating between threads in the first group and threads in the second group.

22. The apparatus of claim 21, wherein the threads from the first group and the threads from the second group are scheduled to execute every other clock cycle.

23. The apparatus of claim 21, wherein the instructions of threads in the first group have alternating reads and writes to the first processor storage device on successive clock cycles.

24. The apparatus of claim 23, wherein the instructions of threads in the second group have alternating reads and writes to the second processor storage device on successive clock cycles.

25. The apparatus of claim 23, wherein the first processor storage device includes only two access ports.

\* \* \* \* \*